(12) United States Patent
Kakimoto et al.

(10) Patent No.: US 8,361,550 B2
(45) Date of Patent: Jan. 29, 2013

(54) METHOD FOR FORMING SRTIO$_3$ FILM AND STORAGE MEDIUM

(75) Inventors: Akinobu Kakimoto, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 12/529,356

(22) PCT Filed: Feb. 27, 2008

(86) PCT No.: PCT/JP2008/053391
§ 371 (c)(1),
(2), (4) Date: Sep. 1, 2009

(87) PCT Pub. No.: WO2008/105451
PCT Pub. Date: Sep. 4, 2008

(65) Prior Publication Data
US 2010/0015335 A1    Jan. 21, 2010

(30) Foreign Application Priority Data
Mar. 1, 2007   (JP) ................... 2007-051374

(51) Int. Cl.
*C23C 16/40* (2006.01)

(52) U.S. Cl. ......... 427/255.31; 427/255.32; 427/255.36; 117/84

(58) Field of Classification Search ............. 427/255.31, 427/255.32, 255.36; 117/84
See application file for complete search history.

(56) References Cited

U.S. PATENT DOCUMENTS

| | | | |
|---|---|---|---|
| 7,141,278 B2 * | 11/2006 | Koh et al. | |
| 7,485,349 B2 * | 2/2009 | Koh et al. | |
| 7,514,119 B2 * | 4/2009 | Ma et al. | |
| 7,638,074 B2 * | 12/2009 | Xu et al. | 260/665 R |
| 2002/0168553 A1 * | 11/2002 | Lee et al. | |
| 2002/0180028 A1 * | 12/2002 | Borovik et al. | 257/700 |
| 2004/0040494 A1 * | 3/2004 | Vaartstra et al. | 117/104 |
| 2005/0260348 A1 * | 11/2005 | Lee et al. | |
| 2006/0292841 A1 * | 12/2006 | Quick | 438/584 |
| 2010/0143607 A1 * | 6/2010 | Lei et al. | 427/569 |
| 2010/0291299 A1 * | 11/2010 | Cameron et al. | 427/255.6 |

FOREIGN PATENT DOCUMENTS

| | | | |
|---|---|---|---|
| JP | 7 188271 | * | 7/1995 |
| JP | 7 268634 | * | 10/1996 |
| JP | 2002 367982 | * | 12/2002 |
| JP | 2005 166965 | * | 6/2005 |
| JP | 2005 277426 | * | 10/2005 |
| JP | 2006 310865 | * | 11/2006 |

OTHER PUBLICATIONS

Sato, Mitsunobu, et al., "SrTiO3 film fabrication and powder synthesis from a non-polymerized precursor system of a stable Ti(IV) complex and Sr(II) salt of edta". J. Mater. Chem., 1999, 9, 1539-1542.*

Marozau, I., et al., "One-step preparation of N-doped strontium titanate films by pulsed laser deposition". Appl. Phys. A 89, 933-940 (2007).*

Gao, Yanfeng, et al., "Microstructure-Controlled Deposition of SrTiO3 Thin Film on Self-Assembled Monolayers in an Aqueous Solution of (NH4)2TiF6-Sr(NO3)2-H3NO3". Chem. Mater. 2003, 15, 2399-2410.*

Lee, J.H. et al., "Plasma enhanced atomic layer deposition of SrTiO$_3$ thin films with Sr(tmhd)$_2$ and Ti(i-OPr)$_4$ ", J. Vac. Sci. Technol., vol. A20, No. 5, pp. 1828-1830, (Sep.-Oct. 2002).*

* cited by examiner

*Primary Examiner* — Bret Chen
(74) *Attorney, Agent, or Firm* — Rothwell, Figg, Ernst and Manbeck, P.C.

(57) ABSTRACT

A substrate is arranged in a processing chamber, the substrate is heated, a Ti material is introduced into the processing chamber in the form of gas, the Ti material is oxidized by introducing an oxidizing agent in the form of gas, a Sr material is introduced into the processing chamber in the form of gas, the Sr material is oxidized by introducing the oxidizing agent in the form of gas, and a SrTiO$_3$ film is formed on the substrate. As the Sr material, a Sr amine compound or a Sr imine compound is used.

15 Claims, 3 Drawing Sheets

METHOD FOR FORMING SRTIO₃ FILM AND STORAGE MEDIUM

FIELD OF THE INVENTION

The present invention relates to a method for forming an $SrTiO_3$ film by chemical vapor deposition (CVD) or atomic layer deposition (ALD) and a storage medium.

BACKGROUND OF THE INVENTION

In response to the trend toward high integration of integrated circuits in semiconductor devices, DRAMs require smaller memory cells and larger memory capacity. With respect to this requirement, metal-insulator-metal (MIM) capacitors have been given attention. MIM capacitors employ a high-k dielectric material such as strontium titanate ($SrTiO_3$) as a material of an insulating film (dielectric film).

As for the method for forming $SrTiO_3$ films for DRAM capacitors, conventionally, there is widely used an atomic layer deposition (ALD) method using $Sr(DPM)_2$ serving as an Sr material, $Ti(O-iPr)_4$ or $Ti(O-iPr)_2(DPM)_2$ serving as a Ti material, and an $O_3$ gas, an $O_2$ gas, $H_2O$ or $O_2$ plasma serving as an oxidizing agent (e.g., J. H. Lee et al. "Plasma enhanced atomic layer deposition of $SrTiO_3$ thin films with $Sr(tmhd)_2$ and $Ti(i-OPr)_4$"

J. Vac. Sci. Technol. A20(5), September/October 2002 (Non-patent document 1).

However, $Sr(DPM)_2$ used as an Sr material has a low vapor pressure and is hardly adsorbed on the surface of a substrate. Accordingly, it has disadvantages of low throughput and bad coverage due to its low film forming rate. Further, $Sr(DPM)_2$ should be heated to a temperature exceeding 200° C. to be provided in a gas phase. Further, $Sr(DPM)_2$ requires the use of a heat-resistant material for piping system or the like, thus incurring an increase in equipment costs. Further, $Sr(DPM)_2$ is not readily adsorbed on the substrate surface, as mentioned above, is easily decomposed in a gas phase, and is hardly oxidized by an oxidizing agent after adsorption, so that it is difficult to form an oxide film. Accordingly, it is difficult to determine optimal supply conditions of Sr material or oxidizing agent for ALD.

SUMMARY OF THE INVENTION

It is an object of the present invention to provide a method for forming an $SrTiO_3$ film that is capable of forming the film with a high throughput and high coverage, gasifying sources at a low temperature equal to or less than 200° C. and forming the film under optimal conditions.

It is another object of the present invention to provide a storage medium storing a program to execute the method.

In accordance with a first aspect of the present invention, there is provided a method for forming an $SrTiO_3$ film, comprising the steps of: placing a substrate in a processing chamber; heating the substrate; and introducing a gaseous Sr material, a gaseous Ti material and a gaseous oxidizing agent into the processing chamber, wherein an Sr amine compound or an Sr imine compound is used as the Sr material, and the Sr material, the Ti material and the oxidizing agent are reacted with each other on the heated substrate to form an $SrTiO_3$ film on the substrate.

In accordance with a second aspect of the present invention, there is provided a method for forming an $SrTiO_3$ film, comprising the steps of: placing a substrate in a processing chamber; heating the substrate; and introducing a gaseous Sr material, a gaseous Ti material and a gaseous oxidizing agent into the processing chamber, wherein an Sr amine compound or an Sr imine compound is used as the Sr material, wherein said introducing step includes the sub-steps of: adsorbing the Ti material on the substrate by introducing the gaseous Ti material into the processing chamber; forming a Ti-containing oxide film by introducing the gaseous oxidizing agent into the processing chamber to decompose the adsorbed Ti material; adsorbing the Sr material on the Ti-containing oxide film by introducing the gaseous Sr material into the processing chamber; and forming an Sr-containing oxide film by introducing the gaseous oxidizing agent into the processing chamber to decompose the adsorbed Sr material, and wherein the sub-steps are repeated as one cycle several times to deposit thin films for respective cycles such that an $SrTiO_3$ film having a predetermined thickness is formed on the substrate.

In the second aspect, the method may further include the step of: purging the processing chamber, between the sub-steps of adsorbing the Ti material, forming the Ti-containing oxide film, adsorbing the Sr material, and forming the Sr-containing oxide film.

In the first or second aspect, a compound represented by $C_{24}H_{46}N_4Sr$ or $C_{26}H_{50}N_4Sr$ may be used as the Sr material. The Sr material may be heated to 100 to 200° C. and supplied by bubbling. Further, the Sr material may be dissolved in a solvent, and heated to 100 to 200° C. and vaporized in a vaporizer to be supplied into the processing chamber. The solvent may be a long straight-chain hydrocarbon or a cyclic hydrocarbon. The solvent may be octane or cyclohexane.

In accordance with a third aspect of the present invention, there is provided a computer-readable storage medium storing a program which runs on a computer and, when executed, controls a film forming apparatus to perform a method for forming an $SrTiO_3$ film, the method including: placing a substrate in a processing chamber; heating the substrate; and introducing a gaseous Sr material, a gaseous Ti material and a gaseous oxidizing agent into the processing chamber, wherein an Sr amine compound or an Sr imine compound is used as the Sr material, and the Sr material, the Ti material and the oxidizing agent are reacted with each other on the heated substrate to form an $SrTiO_3$ film on the substrate.

In accordance with a fourth aspect of the present invention, there is provided a computer-readable storage medium storing a program which runs on a computer and, when executed, controls a film forming apparatus to perform a method for forming an $SrTiO_3$ film, the method including: placing a substrate in a processing chamber; heating the substrate; and introducing a gaseous Sr material, a gaseous Ti material and a gaseous oxidizing agent into the processing chamber, wherein an Sr amine compound or an Sr imine compound is used as the Sr material, wherein said introducing step includes the sub-steps of: adsorbing the Ti material on the substrate by introducing the gaseous Ti material into the processing chamber; forming a Ti-containing oxide film by introducing the gaseous oxidizing agent into the processing chamber to decompose the adsorbed Ti material; adsorbing the Sr material on the Ti-containing oxide film by introducing the gaseous Sr material into the processing chamber; and forming an Sr-containing oxide film by introducing the gaseous oxidizing agent into the processing chamber to decompose the adsorbed Sr material, and wherein the sub-steps are repeated as one cycle several times to deposit thin films for respective cycles such that an $SrTiO_3$ film having a predetermined thickness is formed on the substrate.

In accordance with the aspects of the present invention, an Sr amine compound or Sr imine compound is used as the Sr material, and these compounds have a high vapor pressure, compared to $Sr(DPM)_2$. Accordingly, a sufficient amount of gas can be supplied and throughput can be improved. Further, both the Sr amine compound, wherein an Sr atom is linked to each N atom by only a single bond, and the Sr imine compound containing Sr—N double bonds are readily adsorbed on the surface of the substrate. Thus, it is possible to form a film with a high coverage. Further, these compounds are more stable than $Sr(DPM)_2$. Thus, it is possible to prevent decomposition in a gas phase or decomposition during adsorption on the surface of the substrate. In the ALD film formation process, the Sr material is adsorbed onto the surface of the substrate, and an oxidizing agent such as $O_3$ gas is then adsorbed thereon. The oxidizing agent reacts with the Sr material only when the oxidizing agent is adsorbed on the Sr material, to thereby form an oxide film. Therefore, the adsorption and reaction steps required for ALD can be clearly performed, and supply conditions of Sr materials and an oxidizing agent for ALD can be appropriately determined.

DETAILED DESCRIPTION OF THE EMBODIMENTS

Hereinafter, embodiments of the present invention will be described with reference to the accompanying drawings which form a part hereof.

Figure 1:
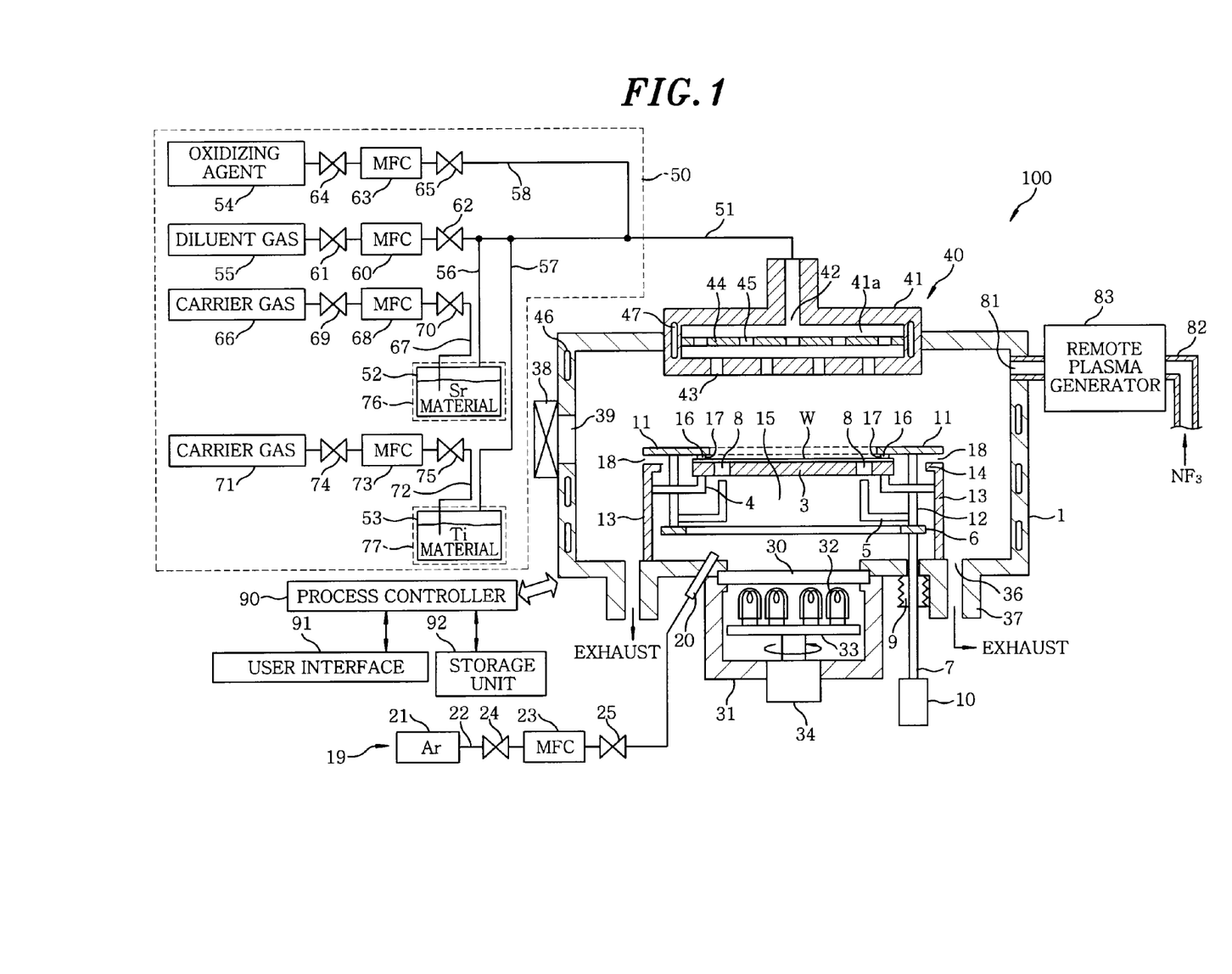
FIG. 1 is a cross sectional view illustrating a schematic structure of a film forming apparatus in accordance with an embodiment of the present invention.

FIG. 1 is a cross sectional view illustrating a schematic configuration of a film forming apparatus which can be used to perform a film forming method in accordance with an embodiment of the present invention. The film forming apparatus 100 shown in FIG. 1 includes a cylindrical or box-shaped processing chamber 1 made of, e.g., aluminum, and the processing chamber 1 is provided with a mounting table 3 for mounting thereon a semiconductor wafer W serving as a substrate to be processed. The mounting table 3 is made of a 1 mm-thick carbon material or aluminum compound, e.g., aluminum nitride.

A cylindrical partition wall 13 made of a material such as aluminum, stands from the bottom of the processing chamber 1 at the peripheral side of the mounting table 3. The partition wall 13 has a bent portion 14 at the top, which is bent in a horizontal direction to form, e.g., an L shape. As the cylindrical partition wall 13 is installed, an inert gas purge area 15 is formed at the backside of the mounting table 3. The top surface of the bent portion 14 is substantially flush with the top surface of the mounting table 3 and is spaced from the outer periphery of the mounting table 3 with connection rods 12 inserted therebetween. The mounting table 3 is supported by three supporting arms 4 (only two of them are shown in FIG. 1) that extend from an upper inner portion of the partition wall 13.

A plurality of, e.g., three, L-shaped lifter pins 5 (only two of them are shown in FIG. 1) are provided under the mounting table 3 to protrude upward from a ring-shaped support member 6. The support member 6 is movable up and down by an elevation rod 7 which passes through the bottom of the processing chamber 1, and the elevation rod 7 is moved up and down by an actuator 10 arranged below the processing chamber 1. The mounting table 3 has insertion through holes 8 at portions corresponding to the lifter pins 5, so that lifter pins 5 can project from the insertion through holes 8 to lift up the semiconductor wafer W when the lifter pins 5 are moved up by the actuator 10 through the elevation rod 7 and support member 6. The portion of the processing chamber 1 into which the elevation rod 7 is inserted is covered with a bellows 9 to prevent outside gas from entering the processing chamber 1 through this portion.

An annular clamp ring 11 made of ceramic, e.g., aluminum nitride, corresponding to the outline of a semiconductor wafer W, is arranged at the outer periphery of the mounting table 3 to hold and fix the outer periphery of the semiconductor wafer W onto the mounting table 3. The clamp ring 11 is connected to the support member 6 through the connection rods 12, thus being moved up and down with the lifter pins 5. The lifter pins 5, the connection rods 12 or the like are made of ceramic such as alumina.

A plurality of contact protrusions 16 are formed at a lower surface of the inner peripheral side of the clamp ring 11 to be substantially equally spaced from one another in a circumferential direction. When the semiconductor wafer W is clamped, the bottoms of the contact protrusions 16 come into contact with the top of the peripheral portion of the semiconductor wafer W to press the wafer W. Further, the contact protrusions 16 have a diameter of about 1 mm and a height of about 50 μm. When the semiconductor wafer W is clamped, a first gas purge gap 17 is formed annularly at the portion including the contact protrusions 16. Further, an overlapping amount of the peripheral portion of the semiconductor wafer W and the inner periphery of the clamp ring 11 (a passage length L1 of the first gas purge gap 17) is several millimeters (mm).

A peripheral portion of the clamp ring 11 is arranged above the bent portion 14 formed at the upper end of the partition wall 13, and a second gas purge gap 18 having a ring shape is formed therebetween. The width of the second gas purge gap 18 is about 500 μm, which is about 10 times larger than the width of the first gas purge gap 17. An overlapping amount of the peripheral portion of the clamp ring 11 and the bent portion 14 (a passage length of the second gas purge gap 18) is, e.g., about 10 mm. Accordingly, inert gases present in the inert gas purge area 15 may be discharged through both side gaps 17 and 18 into a processing space.

An inert gas supplier 19 is provided at a bottom portion of the processing chamber 1 to supply an inert gas to the inert gas purge area 15. The inert gas supplier 19 includes a gas nozzle 20 for introducing an inert gas, e.g., Ar gas, into the inert gas purge area 15, an Ar gas supply source 21 for supplying an Ar gas as the inert gas, and a gas line 22 for supplying an Ar gas from the Ar gas supply source 21 to the gas nozzle 20. Further, the gas line 22 is provided with a mass flow controller 23 serving as a flow rate controller, and valves 24 and 25. Helium (He) gas or the like may be used as the inert gas, instead of the Ar gas.

A transmission window 30 made of a heat ray transmission material such as quartz is hermetically arranged at a position directly under the mounting table 3 at the bottom portion of the processing chamber 1, and a box-shaped heating chamber 31 is arranged therebelow to surround the transmission window 30. The heating chamber 31 is provided with a plurality of heating lamps 32 serving as a heating means, which are mounted on a rotatable table 33 also serving as a reflective mirror. The rotatable table 33 is rotated by a rotating motor 34 provided at a bottom portion of the heating chamber 31 through a rotation axis. Accordingly, heat rays emitted from the heating lamps 32 are irradiated to the backside of the mounting table 3 through the transmission window 30, thereby heating the mounting table 3.

Further, a gas exhaust port 36 is provided at a peripheral portion of the bottom portion of the processing chamber 1. The gas exhaust port 36 is connected to a gas exhaust line 37 which is connected to a vacuum pump (not shown). By exhausting gases through the exhaust port 36 and the gas exhaust line 37, the inner pressure of the processing chamber 1 can be maintained at a desired vacuum level. Further, the processing chamber 1 is provided, at the sidewall thereof, with a loading/unloading port 39, through which a semiconductor wafer W is loaded or unloaded, and a gate valve 38 to open or close the loading/unloading port 39.

Meanwhile, a showerhead 40 is provided at a ceiling portion of the processing chamber 1 that faces the mounting table 3 to supply, e.g., a source gas into the processing chamber 1. The showerhead 40 includes a disc-shaped main body 41, which is made of, e.g., aluminum and has a space 41a therein. A gas inlet port 42 is provided at a ceiling portion of the main body 41. The gas inlet port 42 is connected, through a line 51, to a processing gas supply mechanism 50 for supplying a processing gas required for formation of an $SrTiO_3$ film. A plurality of gas injection holes 43 are arranged over the entire surface of a bottom portion of the main body 41 of the showerhead 40 to discharge the gas supplied into the main body 41 to the processing space provided in the processing chamber 1, so that the gas is discharged onto the entire surface of the semiconductor wafer W.

Further, a diffusion plate 44 having a plurality of gas dispersion holes 45 is disposed in the space 41a of the main body 41, so that the gas can be more uniformly supplied to the surface of the semiconductor wafer W. Further, cartridge heaters 46 and 47 for temperature control are provided inside the sidewalls of the processing chamber 1 and the showerhead 40, respectively, thus enabling the temperature of the sidewall or the showerhead in contact with the gas to be maintained at a desired level.

The processing gas supply mechanism 50 includes an Sr material reservoir 52 for storing an Sr material, a Ti material reservoir 53 for storing a Ti material, an oxidizing agent supply source 54 for supplying an oxidizing agent, and a diluent gas supply source 55 for supplying a diluent gas, such as argon gas, to dilute gases in the processing chamber 1.

The line 51 connected to the showerhead 40 is connected to a line 56 extending from the Sr material reservoir 52, a line 57 extending from the Ti material reservoir 53 and a line 58 extending from the oxidizing agent supply source 54, and is connected to the diluent gas supply source 55. The line 51 is provided with a mass flow controller (MFC) 60 serving as a flow rate controller, and valves 61 and 62 located at the upstream and downstream sides of the MFC 60. Further, the line 58 is provided with a mass flow controller (MFC) 63 serving as a flow rate controller and valves 64 and 65 located at the upstream and downstream sides of the MFC 63.

The Sr material reservoir 52 is connected, through the line 67, to a carrier gas supply source 66 for supplying a carrier gas used to bubble a gas, e.g., Ar. The line 67 is provided with a mass flow controller (MFC) 68 serving as a flow rate controller, and valves 69 and 70 located at the upstream and downstream sides of the MFC 68. Further, the Ti material reservoir 53 is connected, through the line 72, to a carrier gas supply source 66 for supplying a carrier gas such as an Ar gas. The line 72 is provided with a mass flow controller (MFC) 73 serving as a flow rate controller, and valves 74 and 75 located at the upstream and downstream sides of the MFC 73. The Sr material reservoir 52 and the Ti material reservoir 53 are provided with heaters 76 and 77, respectively. Further, the Sr material stored in the Sr material reservoir 52 and Ti material stored in the Ti material reservoir 53 are bubbled, while being heated by the heaters 76 and 77, and then supplied to the processing chamber 1. Although not shown, a line for supplying an Sr or Ti material in a vaporized state is also provided with a heater.

An Sr amine compound or an Sr imine compound is used as the Sr material. The Sr amine compound contains only single bonds between Sr and N, as represented by the following Formula (1). The Sr imine compound contains double bonds between Sr and N, as represented by the following Formula (2).

(1)

(2)

These compounds have a high vapor pressure, are readily adsorbed onto the surface of a substrate and are stable, compared to conventional Sr(DPN) 2, thus being suitable for use in materials for $SrTiO_3$ film, as will be described later. Of these compounds, Sr amine compounds, $C_{24}H_{46}N_4Sr$ and $C_{26}H_{50}N_4Sr$ are preferred. $C_{24}H_{46}N_4Sr$ has the structure represented by Formula (3) and $C_{26}H_{50}N_4Sr$ has the structure represented by Formula (4).

(3)

(4)

$Ti(OiPr)_4$ or $Ti(OiPr) 2 (DPM)_2$, which are conventionally used, may be suitably used as the Ti material.

$O_3$ or $O_2$ gas, or $H_2O$, which is conventionally used, may be used as an oxidizing agent. These may be used alone or in combination thereof. Alternatively, $O_2$ plasma may be used.

The processing chamber 1 is provided, at an upper sidewall thereof, with a cleaning gas inlet port 81, through which $NF_3$ gas serving as a cleaning gas is introduced into the processing chamber 1. The cleaning gas inlet port 81 is connected to a line 82 for supplying a $NF_3$ gas. The line 82 is provided with a remote plasma generator 83. The remote plasma generator 83 converts the $NF_3$ gas supplied through the line 82 into a plasma, and supplies the $NF_3$ plasma into the processing chamber 1, so that the processing chamber 1 is cleaned. Alternatively, the remote plasma generator 83 may be provided directly above the showerhead 40 to supply a cleaning gas through the showerhead 40. Further, plasma-less thermal cleaning using, e.g., ClF$_3$ may be performed without using remote plasma.

The film forming apparatus 100 includes a process controller 90 having a micro processor (computer) and its components are connected to the process controller 90 and controlled thereby. Further, a user interface 91, including a keyboard for inputting commands or a display for displaying an operation status of the film forming apparatus 100, is connected to the process controller 90 to allow a process manager to manage the film forming apparatus 100. Further, the process controller 90 is connected to a storage unit 92 which stores recipes including control programs for implementing various processes in the film forming apparatus 100 under control of the process controller 90, or a program for performing a process in each component of the film forming apparatus 100 under process conditions. Further, the recipes can be stored in a storage medium of the storage unit 92. The storage medium may be a hard disk, a semiconductor memory, or a portable storage medium, such as a CD-ROM, a DVD, or a flash memory. Further, the recipes may properly be transmitted from another apparatus via, e.g., a dedicated line.

If necessary, as a certain recipe is retrieved from the storage unit 92 in accordance with an instruction inputted through the user interface 91 and transmitted to the process controller 90, a desired process is performed in the film forming apparatus 100 under control of the process controller 90.

Next, an explanation will be given of a film forming method performed by using the film forming apparatus having the structure described above.

At first, the gate valve 38 is opened, and a semiconductor wafer W is loaded into the processing chamber 1 through the loading/unloading port 39 and placed on the mounting table 3. The semiconductor wafer W is heated by the mounting table 3, which has been heated by heat rays emitted from the heating lamps 32 and transmitted through the transmission window 30. Then, the interior of the processing chamber 1 is vacuum-exhausted by using the vacuum pump (not shown) through the gas exhaust port 36 and gas exhaust line 37, so that the inner pressure of the processing chamber 1 ranges from about 39 to 665 Pa. Further, at this time, the semiconductor wafer W is heated to a temperature of, e.g., 200 to 400° C.

Then, film formation is performed under the conditions that a flow rate of a diluent gas, e.g., Ar, ranges from 100 to 500 mL/min (sccm) and the inner pressure of the processing chamber 1 is adjusted to 39 to 266 Pa. Further, the adjustment of inner pressure of the processing chamber 1 is carried out by using an automatic pressure controller (APC) provided in the gas exhaust line 37.

Figure 2:
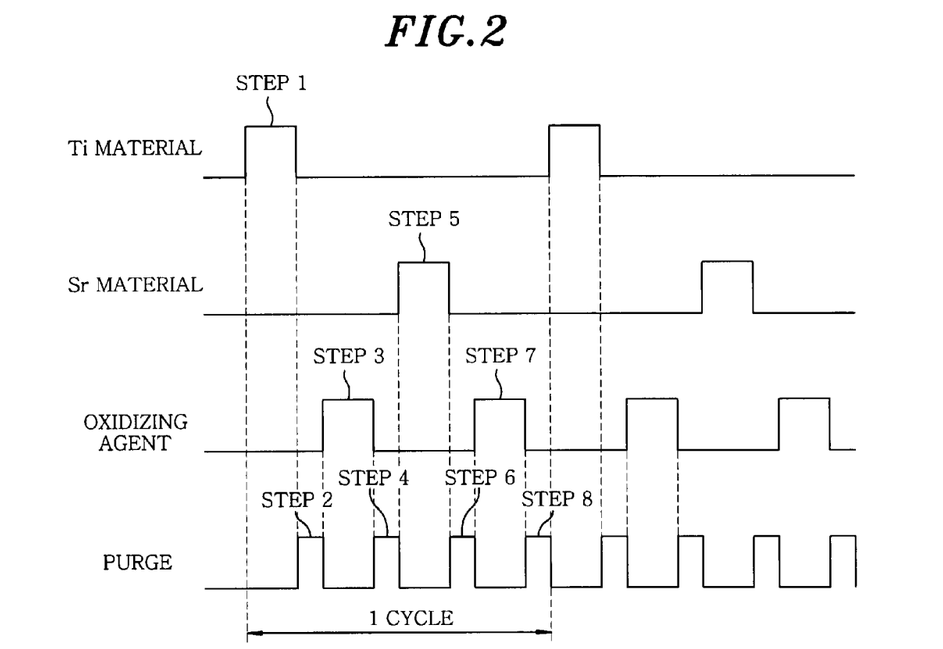
FIG. 2 illustrates a sequence of a film forming method in accordance with the embodiment of the present invention.

In this embodiment, the film formation is practically carried out by using an atomic layer deposition (ALD) method having the sequence shown in FIG. 2. First, a Ti material such as Ti(OiPr)$_4$ or Ti(OiPr)$_2$(DPM)$_2$ is supplied by bubbling from the Ti material reservoir 53, which is heated to 50 to 70° C. or 150 to 230° C. by using the heater 77, to the semiconductor wafer W inside the processing chamber 1 through the showerhead 40 (step 1). At this time, a diluent gas, e.g., Ar gas is supplied at a flow rate of 100 to 500 mL/min (sccm) from the diluent gas supply source 55 and a carrier gas, e.g., Ar gas, is supplied from the carrier gas supply source 70 at a flow rate of 100 to 500 mL/min (sccm). This process is carried out for a period of, e.g., 0.1 to 20 seconds.

Subsequently, the supply of the carrier gas is stopped to stop the supply of the Ti material, and a diluent gas, e.g., Ar gas is supplied into the processing chamber 1 from the diluent gas supply source 55 at a flow rate of 200 to 1,000 mL/min (sccm), to purge the interior of the processing chamber 1 (step 2). This process is carried out for a period of, e.g., 0.1 to 20 seconds.

Subsequently, while a diluent gas, e.g., Ar gas is discharged from the diluent gas supply source 55 at a flow rate of about 100 to 500 mL/min (sccm), an oxidizing agent is supplied onto the semiconductor wafer W in the processing chamber 1 through the showerhead 40 from the oxidizing agent supply source 54 (step 3). As a result, the Ti material adsorbed on the surface of the semiconductor wafer W is decomposed, and at the same time, oxidized to form a TiOx film. This process is performed for a period of, e.g., 0.1 to 20 seconds. When the O$_3$ gas is used as the oxidizing agent, it is supplied at a flow rate of about 50 to 200 g/Nm$^3$, by using an ozonizer as the oxidizing agent supply source 54. At this time, the O$_3$ gas may be used in conjunction with an O$_2$ gas, which is supplied at a flow rate of about 100 to 1,000 mL/min (sccm).

Subsequently, the supply of the oxidizing agent is stopped, and a diluent gas is supplied into the processing chamber 1 from the diluent gas supply source 55 under the same conditions as in step 2, to purge the interior of the processing chamber 1 (step 4).

Subsequently, an Sr amine compound (e.g., C$_{24}$H$_{46}$N$_4$Sr or C$_{26}$H$_{50}$N$_4$Sr) or Sr imine compound serving as the Sr material is supplied onto the semiconductor wafer W in the processing chamber 1 by an Ar gas through the showerhead 40 from the Sr material reservoir 52 heated to about 100 to 200° C. by the heater 76 (step 5). As a result, the Sr material is adsorbed on the surface of the TiOx film. At this time, a diluent gas, e.g., Ar gas, is supplied from the diluent gas supply source 55 at a flow rate of 100 to 500 mL/min (sccm) and a carrier gas, e.g., Ar gas, is supplied from the carrier gas supply source 66 at a flow rate of 100 to 500 mL/min (sccm). This process is carried out for a period of, e.g., 0.1 to 20 seconds.

Subsequently, the supply of the carrier gas is stopped to stop the supply of the Sr material, and a diluent gas, e.g., Ar gas, is supplied into the processing chamber 1 from the diluent gas supply source 55 under the same conditions as in step 2, to purge the interior of the processing chamber 1 (step 6).

Subsequently, while the diluent gas is discharged from the diluent gas supply source 55 under the same conditions as in step 3, an oxidizing agent is supplied onto the semiconductor wafer W in the processing chamber 1 through the showerhead 40 from the oxidizing agent supply source 54 (step 7).

Subsequently, the supply of the oxidizing agent is stopped, and a diluent gas is supplied into the processing chamber 1 from the diluent gas supply source 55 under the same conditions as in step 2 to purge the interior of the processing chamber 1 (step 8).

A series of steps 1 to 8 mentioned above are repeated 20 times or more, e.g., 100 times, to form an SrTiO$_3$ film having a predetermined thickness.

After formation of the film, an oxidizing agent, e.g., O$_2$ gas is supplied from the oxidizing agent supply source 54 at a predetermined flow rate to completely oxidize the film, and the supply of all gases is stopped. Then, the processing chamber is vacuum-exhausted, and the semiconductor wafer W is unloaded from the processing chamber 1 by using a transfer arm.

The process controller 90 controls the valves or mass flow controllers in accordance with the sequence as mentioned above based on recipes stored in the storage section 92.

In the above-described film forming process, an Sr amine compound or Sr imine compound is used as the Sr material, and these compounds have a higher vapor pressure than that of Sr(DPM)$_2$, which is a conventionally used Sr material. For example, Sr(DPM)$_2$ has a vapor pressure of 13.3 Pa (0.1 Torr) at 231° C., C$_{24}$H$_{46}$N$_4$Sr has a vapor pressure of 6.67 Pa (0.05 Torr) at 110° C., and C$_{26}$H$_{50}$N$_4$Sr has a vapor pressure of 6.67 Pa at 125° C. Accordingly, a sufficient amount of gas can be supplied and throughput can be improved. Further, both an Sr amine compound, wherein an Sr atom is linked to each of N atoms only by a single bond, and an Sr imine compound containing Sr—N double bonds are readily adsorbed on the surface of the substrate. Thus, it is possible to form a film with a high coverage. Further, these compounds are more stable than Sr(DPM)$_2$. Thus, it is possible to prevent decomposition in a gas phase or decomposition during adsorption on the surface of the substrate.

Figure 3:
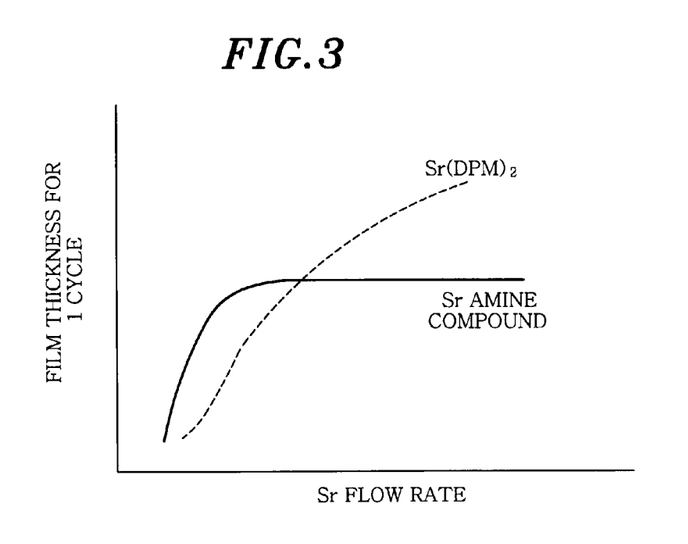
FIG. 3 is a graph showing a relationship between Sr flow rate and Sr film thickness for one cycle for respective Sr materials.

The Sr material is adsorbed onto the surface of the substrate, and an oxidizing agent is then adsorbed thereon. The oxidizing agent reacts with the Sr material only when the oxidizing agent is adsorbed on the Sr material, to thereby form an oxide film. Therefore, the adsorption and reaction steps required for ALD can be clearly performed, supply conditions of Sr materials and an oxidizing agent for ALD can be appropriately determined and a high throughput sequence can be designed. For example, as shown in FIG. 3, wherein an Sr flow rate is plotted on a horizontal axis, and a film thickness for one cycle is plotted on a vertical axis, in case of Sr(DPM)$_2$, a film thickness for one cycle is not saturated with respect to an Sr flow rate, whereas in case of Sr amine compound or Sr imine compound, a film thickness for one cycle is saturated with respect to an Sr flow rate. Thus, a flow rate can be easily determined based on the flow rate obtained at the saturated point.

Figure 4:
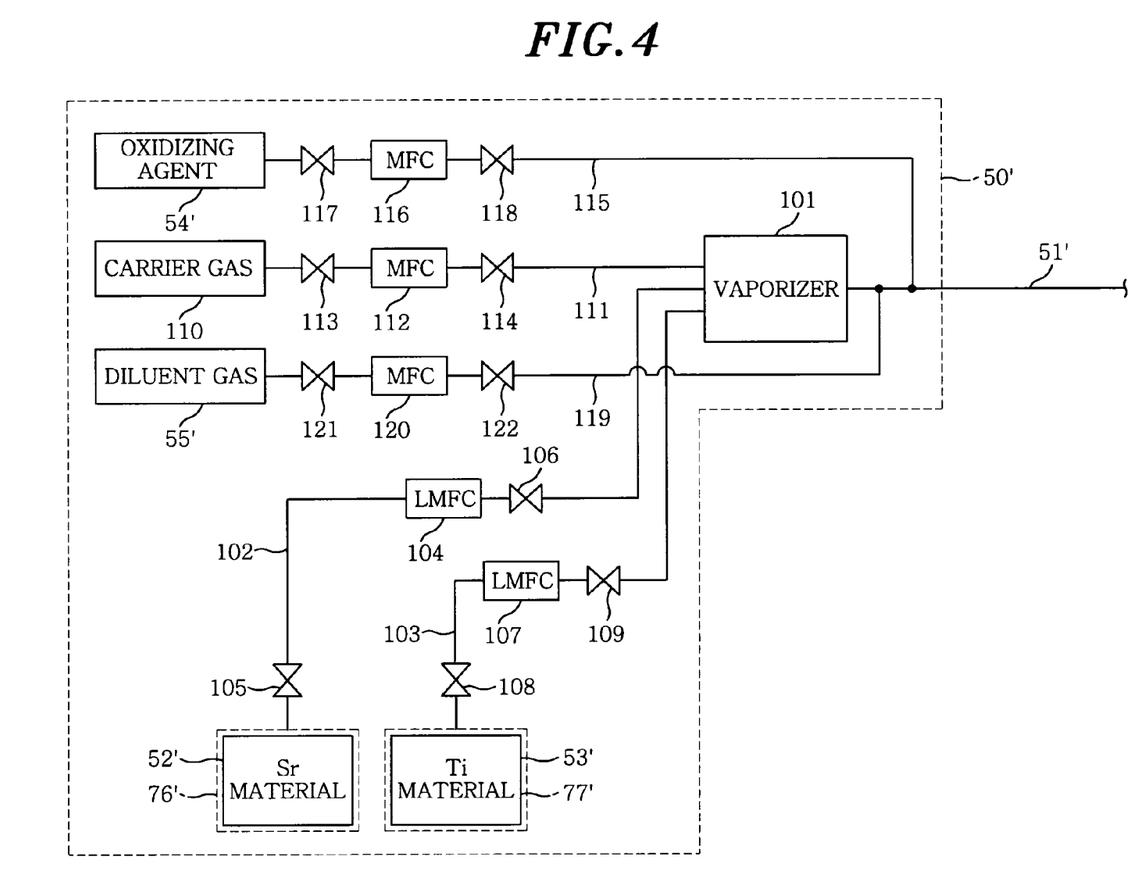
FIG. 4 illustrates another example of a processing gas supply mechanism.

Although the processing gas supply mechanism 50 for supplying sources by bubbling is used in the film forming apparatus mentioned above, a processing gas supply mechanism 50' for supplying sources with a vaporizer as shown in FIG. 4 may be used. The processing gas supply mechanism 50' includes an Sr material reservoir 52' to store an Sr material dissolved in a solvent, a Ti material reservoir 53' to store a Ti material dissolved in a solvent, an oxidizing agent supply source 54' to supply an oxidizing agent, and a vaporizer 101 to gasify Sr and Ti materials. A line 102 is provided from the Sr material reservoir 52' to the vaporizer 101, and a line 103 is provided from the Ti material reservoir 53' to the vaporizer 101. A liquid is supplied from the Sr material reservoir 52' and the Ti material reservoir 53' to the vaporizer 101 by a pressure-feed gas, pump or the like.

The line 102 is provided with a liquid mass flow controller (LMFC) 104 serving as a flow rate controller, and valves 105 and 106 located at the upstream and downstream sides thereof. Further, the line 103 is provided with a liquid mass flow controller (LMFC) 107 and valves 108 and 109 located at the upstream and downstream sides thereof. The Sr material reservoir 52' and the Ti material reservoir 53' are provided with a heater 76' and a heater 77', respectively. Further, the Sr material dissolved in a solvent and stored in the Sr material reservoir 52' and the Ti material dissolved in a solvent and stored in the Ti material reservoir 53' are heated to predetermined temperatures by the corresponding heaters 76' and 77' and are thus supplied in a liquid state to the vaporizer 101 by a pump or pressure-feed gas. Further, although not illustrated, the lines, allowing passage of Sr and Ti materials, may be provided with heaters.

The vaporizer 101 is connected to a line 51' which extends to the showerhead 40. The vaporizer 101 is connected to a line 111 which extends from the carrier gas supply source 110 to supply a carrier gas, e.g., Ar gas, to the vaporizer 101. The carrier gas supplied to the vaporizer 101 carries Sr and Ti materials, which have heated to a predetermined temperature, e.g., 100 to 200° C. and then vaporized in the vaporizer 101, into the processing chamber 1 through the line 51' and the showerhead 40. The line 111 is provided with a mass flow controller (MFC) 112 serving as a flow rate controller and valves 113 and 114 located at the upstream and downstream sides thereof. A line 115 is provided from the oxidizing agent supply source 54' to the line 51', to supply an oxidizing agent from the line 115 into the processing chamber 1 through the line 51' and the showerhead 40. The line 115 is provided with a mass flow controller MFC 116 serving as a flow rate controller and valves 117 and 118 located at the upstream and downstream sides thereof.

The gas supply mechanism 50' includes a diluent gas supply source 55' to supply a diluent gas such as argon gas to dilute gases present in the processing chamber 1. The diluent gas supply source 55' is provided with a line 119 extending to the line 51', allowing an argon gas for dilution to be supplied into the processing chamber 1 through the line 51' and the showerhead 40. The line 119 is provided with a mass flow controller MFC 120 serving as a flow rate controller and valves 121 and 122 located at the upstream and downstream sides thereof.

When sources dissolved in a solvent and vaporized in the vaporizer 101 are supplied, an Sr amine compound or Sr imine compound, having a high vapor pressure, is used as an Sr material. Accordingly, long straight-chain hydrocarbon such as octane or cyclic hydrocarbon such as cyclohexane can be used as the solvent. Thus, it is possible to prevent reaction of a solute with the solvent such as conventionally used tetrahydrofuran (THF), and to stably achieve the transfer and vaporization.

The formation of SrTiO$_3$ film using the gas supply mechanism 50' is carried out in the same manner as the sequence mentioned above, except for the Ti material flow in step 1 and Sr material flow in step 5.

As for the Ti material flow in step 1, the Ti material in the Ti material reservoir 53' is dissolved in octane or cyclohexane as mentioned above and is then transferred to and vaporized in the vaporizer 101 heated to have a temperature of 150 to 230'. At this time, the concentration preferably ranges from 0.05 to 1 mol/L. Further, a diluent gas, e.g., Ar gas is discharged from the diluent gas supply source 55, at a flow rate of 100 to 500 mL/min (sccm), and a carrier gas, e.g., Ar gas is discharged from the carrier gas supply source 110 at a flow rate of 100 to 500 mL/min (sccm). Further, this step is carried out for the same period as in the supply by bubbling mentioned above.

As for the Sr material flow in step 5, the Sr material in the Sr material reservoir 52' is dissolved in octane or cyclohexane as mentioned above. At this time, the concentration preferably ranges from 0.05 to 1 mol/L. The Sr solution is supplied to the vaporizer 101 heated to 100 to 200° C. and vaporized therein. Further, a diluent gas, e.g., Ar gas is discharged from the diluent gas supply source 55' at a flow rate of 100 to 500 mL/min (sccm), and a carrier gas, e.g., Ar gas is discharged from the carrier gas supply source 110 at a flow rate of 100 to 500 mL/min (sccm) Further, this step is carried out for the same period as in the supply by bubbling mentioned above.

Also when Sr and Ti materials are supplied by using the vaporizer, a series of steps 1 to 8 mentioned above are repeated 20 times or more, e.g., 100 times, to form an SrTiO$_3$ film having a predetermined thickness.

Then, in the same way as in the above-described case, the supply of gases including O$_2$ gas is stopped and the processing chamber 1 is vacuum-exhausted. Then, the semiconductor wafer W is unloaded from the processing chamber 1.

Further, one of the Sr material reservoir and the Ti material reservoir may be configured in the form of a bubbler, and the other may be configured in the form of a vaporizer.

Next, a film formation process in accordance with the above embodiment will be described with reference to Examples and Comparison Examples.

EXAMPLE 1

With reference to the apparatus shown in FIG. 1, a lamp power was controlled such that a mounting table was set at 270° C., i.e., film formation temperature, and a 200-mm Si wafer was loaded into a processing chamber by using an arm of a transfer robot to form an $SrTiO_3$ film. $C_{24}H_{46}N_4Sr$ contained in a vessel heated to 150° C. was supplied as an Sr material into the processing chamber by bubbling while using Ar gas as a carrier gas. $Ti(OiPr)_4$ contained in a vessel heated to 40° C. was supplied as a Ti material into the processing chamber by bubbling while using Ar gas as a carrier gas. Further, $O_3$ and $O_2$ gases were used as oxidizing agents. The lines and the processing chamber were set to have a temperature of 155° C.

After the Si wafer was placed on the mounting table by using the arm, diluent Ar gas was supplied for 30 seconds at a flow rate of 300 mL/min (sccm), and the temperature of the Si wafer was raised to a film formation temperature at a pressure of 133 Pa (1 Torr). While the flow rate of the diluent gas was maintained as described above, the pressure was adjusted to a film formation pressure of 106 Pa (0.8 Torr) at 10 seconds, and film formation was performed in accordance with the series of steps 1 to 8 mentioned above.

Step 1 for supplying a Ti material was carried out for a period of 2 seconds under the conditions that a flow rate of the carrier gas was 100 mL/min (sccm), and a flow rate of the diluent Ar gas was a 100 mL/min (sccm). Step 2 for purging Ar gas was carried out for 1 second at by supplying the diluent gas at a flow rate of 500 mL/min (sccm), while stopping the supply of the carrier Ar gas.

Step 3 for supplying an oxidizing agent was carried out for 2 seconds by feeding $O_3$ gas, $O_2$ gas and diluent Ar gas at flow rates of 200 g/Nm³, 1,000 mL/min (sccm) and 100 mL/min (sccm), respectively. Step 4 for purging Ar gas was carried out for 1 second by stopping the supply of the $O_3$ and $O_2$ gases and feeding the diluent gas at a flow rate of 500 mL/min (sccm) in the same way as in step 2.

Step 5 for supplying an Sr material was carried out for 2 seconds by feeding the carrier Ar gas and the diluent Ar gas at flow rates of 50 mL/min (sccm) and 100 mL/min (sccm), respectively. Step 6 for purging the Ar gas was carried out for 1 second by feeding the diluent Ar gas at a flow rate of 500 mL/min (sccm), while stopping the supply of the carrier Ar gas in the same way as in step 2.

Step 7 for supplying an oxidizing agent and step 8 for purging Ar gas were carried out under the same conditions as in step 3 and step 4.

After steps 1 to 8 were repeated 100 times, $O_2$ gas was fed for 20 seconds at a flow rate of 300 mL/min (sccm) under a film formation pressure. Then, the supply of the gases was stopped for 20 seconds, the processing chamber was vacuum-exhausted, and the Si wafer was unloaded from the processing chamber.

The thickness of the $SrTiO_3$ formed in accordance with the sequence mentioned above was 12 nm.

EXAMPLE 2

With reference to the apparatus shown in FIG. 1, a lamp power was controlled such that a mounting table was set at a film formation temperature of 340° C., and a 200-mm Si wafer was loaded into a processing chamber by using an arm of a transfer robot to form an $SrTiO_3$ film. $C_{26}H_{50}N_4Sr$ serving as an Sr material was dissolved in octane at a concentration of 0.4 mol/L, and pressure-fed to the vaporizer heated to 150° C. by using helium, and supplied into the processing chamber by vaporization while using an Ar gas as a carrier gas. $Ti(OiPr)_4$ serving as a Ti material and contained in a vessel heated to 40° C. was supplied into the processing chamber by bubbling while using an Ar gas as a carrier gas. Further, $O_3$ and $O_2$ gases were used as oxidizing agents.

The lines and the processing chamber were set to have a temperature of 155° C. After the Si wafer was placed on the mounting table by using the arm, diluent Ar gas was supplied for 30 seconds at a flow rate of 300 mL/min (sccm), and the temperature of the Si wafer was raised to a film formation temperature at a pressure of 133 Pa (1 Torr). While the flow rate of the diluent gas was maintained as described above, the pressure was adjusted to a film formation pressure of 106 Pa (0.8 Torr) at 10 seconds, and film formation was performed in accordance with the series of steps 1 to 8 mentioned above.

Steps 1 to 4 were carried out under the same conditions as steps 1 to 4 in Example 1. Step 5 for supplying an Sr material was carried out for 2 seconds by vaporizing $C_{26}H_{50}N_4Sr$ dissolved in octane in the vaporizer and feeding a carrier Ar gas and a diluent Ar gas at flow rates of 50 mL/min (sccm) and 100 mL/min (sccm), respectively. Step 6 for purging the Ar gas was carried out for 1 second by feeding the diluent Ar gas at a flow rate of 500 mL/min (sccm), while stopping the supply of the carrier Ar gas, as in step 2.

Step 7 for supplying an oxidizing agent and step 8 for purging Ar gas were carried out under the same conditions, as in step 3 and step 4.

After steps 1 to 8 were repeated 100 times, an $O_2$ gas was fed for 20 seconds at a flow rate of 300 mL/min (sccm) under a film formation pressure, the supply of the gases was stopped for 20 seconds, the processing chamber was vacuum-exhausted, and the Si wafer was unloaded from the processing chamber.

The thickness of the $SrTiO_3$ formed in accordance with the sequence mentioned above was 13 nm.

COMPARISON EXAMPLE 1

With reference to the apparatus shown in FIG. 1, a lamp power was controlled such that a mounting table was set at 320° C., i.e., film formation temperature, and a 200-mm Si wafer was loaded into a processing chamber by using an arm of a transfer robot to form an $SrTiO_3$ film. $Sr(DPM)_2$ serving as an Sr material and contained in a vessel heated to 200° C. was supplied into the processing chamber by bubbling while using an Ar gas as a carrier gas. $Ti(OiPr)_4$ serving as a Ti material and contained in a vessel heated to 40° C. was supplied into the processing chamber by bubbling while using an Ar gas as a carrier gas. Further, $O_3$ gas was used as an oxidizing agent.

The lines and the processing chamber were set to have a temperature of 180° C. After the Si wafer was placed on the mounting table by using the arm, diluent Ar gas was supplied for 30 seconds at a flow rate of 300 mL/min (sccm), the temperature of the Si wafer was raised to a film formation temperature at a pressure of 133 Pa (1 Torr). While the flow rate of the diluent gas was maintained as described above, the pressure was adjusted to a film formation pressure of 40 Pa (0.3 Torr) at 10 seconds, and film formation was performed in accordance with the series of steps 1 to 8 mentioned above.

Step 1 for supplying a Ti material was carried out for a period of 2 seconds under the conditions that a flow rate of the carrier gas was 100 mL/min (sccm), and a flow rate of the diluent Ar gas was 100 mL/min (sccm). Step 2 for purging Ar gas was carried out for 1 second by feeding the diluent Ar gas at a flow rate of 500 mL/min (sccm), while stopping the supply of the carrier Ar gas.

Step 3 for supplying an oxidizing agent was carried out for 2 seconds by feeding $O_3$ gas and diluent Ar gas at flow rates of 200 g/Nm$^3$ and 100 mL/min (sccm), respectively. Step 4 for purging Ar gas was carried out for 1 second by feeding the diluent Ar gas at 500 mL/min (sccm) while stopping the supply of $O_3$ gas, as in step 2.

Step 5 for supplying the Sr material was carried out for 2 seconds by feeding the carrier Ar gas and the diluent Ar gas at flow rates of 50 mL/min (sccm) and 100 mL/min (sccm), respectively. Step 6 for purging the Ar gas was carried out for 1 second by feeding the diluent Ar gas at a flow rate of 500 mL/min (sccm) while stopping the supply of the carrier Ar gas, as in step 2.

Step 7 for supplying an oxidizing agent and step 8 for purging Ar gas were carried out under the same conditions, as in steps 3 and 4.

After steps 1 to 8 were repeated 100 times, an $O_2$ gas was fed for 20 seconds at a flow rate of 300 mL/min (sccm) under the film formation pressure. Then, the processing chamber was vacuum-exhausted for 20 seconds, while stopping the supply of the gases, and the Si wafer was unloaded from the processing chamber.

The thickness of the SrTiO$_3$ film formed in accordance with the sequence mentioned above was 3 nm, which is smaller than levels obtained in Examples. This is because Sr(DPM)$_2$ having a low vapor pressure was used as the Sr material and a small amount of Sr was supplied in bubbling at 200° C.

COMPARISON EXAMPLE 2

An SrTiO$_3$ film was formed under the same conditions as in Comparison Example 1, except that a film formation temperature was 350° C., Sr(DPM)$_2$ serving as an Sr material was dissolved in THF and supplied after being vaporized in the vaporizer, the source vessel and vaporizer were heated to 310° C., and a film formation pressure was 133 Pa (1 Torr). The thickness of the SrTiO$_3$ film was measured. The thickness thus obtained was 6 nm, which is larger than that obtained in Comparison example 1, but is smaller than that obtained in Examples. The reason is assumed as follows. Although the vaporization temperature is high and the vaporized amount is increased, the temperatures of the lines and processing chamber are still 180° C. Thus, Sr(DPM)$_2$ is re-solidified on the wall of the lines and the processing chamber and only a small amount of the source reaches the wafer.

COMPARISON EXAMPLE 3

An SrTiO$_3$ film was formed under the same conditions as in Comparison Example 2, except that the lines and processing chamber were set to have a temperature of 320° C. As a result, the film thickness was 12 nm, comparable to values obtained in Examples. However, it is necessary to use heat-resistant materials in order to set the temperatures of the lines and processing chamber to high levels. Accordingly, equipment cost is increased due to the replacement of resin valves with all metal valves, the replacement of aluminum with stainless steel in the material of the processing chamber, and the replacement of aluminum with Hastelloy in the material of the showerhead. Thus, its realization is limited.

The results obtained from Examples 1 and 2 and Comparison Examples 1 to 3 are briefly set forth in Table 1 below.

TABLE 1

| | Sr material supply method | | | Ti material supply method | | | | Film forming method | | Film forming rate (nm/100 cycle) |
|---|---|---|---|---|---|---|---|---|---|---|
| | | | Vessel & vaporization temp. (° C.) | Line & processing chamber temp. (° C.) | | | Line & vaporization temp. (° C.) | | Film forming temp. (° C.) | Film forming pressure (Torr) |
| | Sr material type | Supply method | | | Ti material type | Supply method | | Oxygen source Type | Film forming method | |
| Example 1 | Sr(C$_5$(CH$_3$)$_5$)$_2$ | Bubbling | 150 | 155 | Ti(iOPr)$_4$ | Bubbling | 40 | H$_2$O | ALD | 320 | 0.3 | 12 |
| Example 2 | Sr(C$_5$(CH$_3$)$_5$)$_2$ | Bubbling | 150 | 155 | Ti(iOPr)$_4$ | Bubbling | 40 | H$_2$O | ALD | 340 | 0.7 | 11 |
| Example 3 | Sr(C$_5$(CH$_3$)$_5$)$_2$ | toluene dilution DLI | 150 | 155 | Ti(iOPr)$_4$ | Bubbling | 40 | H$_2$O | ALD | 330 | 0.8 | 13 |
| Example 4 | Sr(C$_5$(CH$_3$)$_5$)$_2$ | Bubbling | 150 | 155 | Ti(iOPr)$_4$ | Bubbling | 40 | O$_3$ | ALD | 320 | 0.3 | 13 |
| Comparison Example 1 | Sr(DPM)$_2$ | Bubbling | 200 | 180 | Ti(iOPr)$_4$ | Bubbling | 40 | O$_3$ | ALD | 320 | 0.3 | 3 |
| Comparison Example 2 | Sr(DPM)$_2$ | THF dilution DLI | 310 | 180 | Ti(iOPr)$_4$ | THF dilution DLI | 310 | O$_3$ | ALD | 350 | 1 | 6 |
| Comparison Example 3 | Sr(DPM)$_2$ | THF dilution DLI | 310 | 320 | Ti(iOPr)$_4$ | THF dilution DLI | 310 | O$_3$ | ALD | 350 | 1 | 12 |
| Comparison Example 4 | Sr(C$_5$(CH$_3$)$_5$)$_2$ | THF dilution DLI | 130 | 135 | Ti(iOPr)$_4$ | Bubbling | 40 | O$_2$ | CVD | 600 | 10 | 4 |

The present invention is not limited to the above-described embodiment, but may be variously modified.

For example, although film formation using atomic layer deposition (ALD) has been described in the above-described embodiment, the present invention may be applied to film formation using conventional chemical vapor deposition (CVD). Further, although a lamp is used to heat a target substrate in a film forming apparatus, a resistance heater may be used. Furthermore, although a semiconductor wafer is used as a target substrate in the above-described embodiment, other substrates such as a glass substrate for FPD may be used without being limited thereto.

Industrial Applicability

The method for forming an SrTiO$_3$ film in accordance with the present invention makes it possible to obtain a high-quality film with a high throughput and high coverage. Thus, it is effective for use in an electrode for MIM capacitors.

What is claimed is:

1. A method for forming an SrTiO$_3$ film, comprising the steps of:
   placing a substrate in a processing chamber;
   heating the substrate; and
   introducing a gaseous Sr material, a gaseous Ti material and a gaseous oxidizing agent into the processing chamber,
   wherein the gaseous Sr material is C$_{24}$H$_{46}$N$_4$Sr or C$_{26}$H$_{50}$N$_4$Sr, and the gaseous Sr material, the gaseous Ti material and the gaseous oxidizing agent are reacted with each other on the heated substrate to form a SrTiO$_3$ film on the substrate.

2. The method of claim 1, wherein the gaseous Sr material is obtained by heating a Sr source material to 100 to 200° C. and supplied by bubbling.

3. The method of claim 2, wherein the Sr source material is heated in a Sr material reservoir by a heater provided with the Sr material reservoir.

4. The method of claim 1, wherein a Sr source material is dissolved in a solvent, and heated to 100 to 200° C. and vaporized to thereby obtain the gaseous Sr material in a vaporizer to be supplied into the processing chamber.

5. The method of claim 4, wherein the Sr source material is heated in a Sr material reservoir by a heater provided with the Sr material reservoir.

6. A method for forming a SrTiO$_3$ film, comprising the steps of:
   placing a substrate in a processing chamber;
   heating the substrate;
   introducing a gaseous Sr material, a gaseous Ti material and a gaseous oxidizing agent into the processing chamber,
   wherein a Sr amine compound or a Sr imine compound is used as the gaseous Sr material, and the gaseous Sr material, the gaseous Ti material and the gaseous oxidizing agent are reacted with each other on the heated substrate to form a SrTiO$_3$ film on the substrate,
   wherein a Sr source material is dissolved in a solvent, and heated to 100 to 200° C and vaporized to thereby obtain the gaseous Sr material in a vaporizer to be supplied into the processing chamber, and
   wherein the solvent is cyclohexane.

7. A method for forming an SrTiO$_3$ film, comprising the steps of:
   placing a substrate in a processing chamber;
   heating the substrate; and
   introducing a gaseous Sr material, a gaseous Ti material and a gaseous oxidizing agent into the processing chamber,
   wherein the gaseous Sr material is C$_{24}$H$_{46}$N$_4$Sr or C$_{26}$H$_{50}$N$_4$Sr,
   wherein said introducing step includes the sub-steps of:
      adsorbing the gaseous Ti material on the substrate by introducing the gaseous Ti material into the processing chamber;
      forming a Ti-containing oxide film by introducing the gaseous oxidizing agent into the processing chamber to decompose the adsorbed Ti material;
      adsorbing the gaseous Sr material on the Ti-containing oxide film by introducing the gaseous Sr material into the processing chamber; and
      forming an Sr-containing oxide film by introducing the gaseous oxidizing agent into the processing chamber to decompose the adsorbed Sr material, and
   wherein the sub-steps are repeated as one cycle several times to deposit thin films for respective cycles such that an SrTiO$_3$ film having a predetermined thickness is formed on the substrate.

8. The method of claim 7, further comprising the step of:
   purging the processing chamber, between the sub-steps of adsorbing the gaseous Ti material, forming the Ti-containing oxide film, adsorbing the gaseous Sr material, and forming the Sr-containing oxide film.

9. The method of claim 7, wherein the gaseous Sr material is obtained by heating a Sr source material to 100 to 200° C. and supplied by bubbling.

10. The method of claim 9, wherein the Sr source material is heated in a Sr material reservoir by a heater provided with the Sr material reservoir.

11. The method of claim 7, wherein a Sr source material is dissolved in a solvent, and heated to 100 to 200° C. and vaporized to thereby obtain the gaseous Sr material in a vaporizer to be supplied into the processing chamber.

12. The method of claim 11, wherein the source material is heated in a Sr material reservoir by a heater provided with the Sr material reservoir.

13. A method for forming a SrTiO$_3$ film, comprising the steps of:
   placing a substrate in a processing chamber;
   heating the substrate; and
   introducing a gaseous Sr material, a gaseous Ti material and a gaseous oxidizing agent into the processing chamber,
   wherein a Sr amine compound or a Sr imine compound is used as the gaseous Sr material,
   wherein said introducing step includes the sub-steps of:
      adsorbing the gaseous Ti material on the substrate by introducing the gaseous Ti material into the processing chamber;
      forming a Ti-containing oxide film by introducing the gaseous oxidizing agent into the processing chamber to decompose the adsorbed Ti material;
      adsorbing the gaseous Sr material on the Ti-containing oxide film by introducing the gaseous Sr material into the processing chamber; and
      forming a Sr-containing oxide film by introducing the gaseous oxidizing agent into the processing chamber to decompose the adsorbed Sr material,
   wherein the sub-steps are repeated as one cycle several times to deposit thin films for respective cycles such that a SrTiO$_3$ film having a predetermined thickness is formed on the substrate,
   wherein a Sr source material is dissolved in a solvent, and heated to 100 to 200° C. and vaporized to thereby obtain the gaseous Sr material in a vaporizer to be supplied into the processing chamber, and
   wherein the solvent is cyclohexane.

14. A non-transitory computer-readable storage medium storing a program which runs on a computer and, when executed, controls a film forming apparatus to perform a method for forming an SrTiO$_3$ film, the method including:
   placing a substrate in a processing chamber;
   heating the substrate; and introducing a gaseous Sr material, a gaseous Ti material and a gaseous oxidizing agent into the processing chamber, wherein the gaseous Sr material is $C_{24}H_{46}N_4Sr$ or $C_{26}H_{50}N_4Sr$, and the gaseous Sr material, the gaseous Ti material and the gaseous oxidizing agent are reacted with each other on the heated substrate to form an $SrTiO_3$ film on the substrate.

15. A non-transitory computer-readable storage medium storing a program which runs on a computer and, when executed, controls a film forming apparatus to perform a method for forming an $SrTiO_3$ film, the method including:

placing a substrate in a processing chamber;

heating the substrate; and introducing a gaseous Sr material, a gaseous Ti material and a gaseous oxidizing agent into the processing chamber, wherein the gaseous Sr material is $C_{24}H_{46}N_4Sr$ or $C_{26}H_{50}N_4Sr$, wherein said introducing step includes the sub-steps of:

adsorbing the gaseous Ti material on the substrate by introducing the gaseous Ti material into the processing chamber;

forming a Ti-containing oxide film by introducing the gaseous oxidizing agent into the processing chamber to decompose the adsorbed Ti material;

adsorbing the gaseous Sr material on the Ti-containing oxide film by introducing the gaseous Sr material into the processing chamber; and forming an Sr-containing oxide film by introducing the gaseous oxidizing agent into the processing chamber to decompose the adsorbed Sr material, and wherein the sub-steps are repeated as one cycle several times to deposit thin films for respective cycles such that an $SrTiO_3$ film having a predetermined thickness is formed on the substrate.

* * * * *